US008804399B2

(12) United States Patent
Sills

(10) Patent No.: US 8,804,399 B2
(45) Date of Patent: Aug. 12, 2014

(54) MULTI-FUNCTION RESISTANCE CHANGE MEMORY CELLS AND APPARATUSES INCLUDING THE SAME

(75) Inventor: Scott Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 13/428,944

(22) Filed: Mar. 23, 2012

(65) Prior Publication Data

US 2013/0250651 A1  Sep. 26, 2013

(51) Int. Cl.
*G11C 11/00* (2006.01)
*G11C 13/00* (2006.01)
*G11C 11/56* (2006.01)

(52) U.S. Cl.
CPC ........ *G11C 13/0002* (2013.01); *G11C 13/0011* (2013.01); *G11C 2013/0092* (2013.01); *G11C 2013/0078* (2013.01); *G11C 11/5685* (2013.01)
USPC ...................................... 365/148; 365/185.18

(58) Field of Classification Search
CPC ............. G11C 13/002; G11C 13/0011; G11C 11/5685; G11C 2013/0092; G11C 2013/0078
USPC ............................................ 365/148, 185.18
See application file for complete search history.

(56) References Cited

U.S. PATENT DOCUMENTS

| 6,460,172 | B1 | 10/2002 | Insenser Farre et al. |
| 7,053,470 | B1 | 5/2006 | Sellers et al. |
| 7,382,647 | B1 * | 6/2008 | Gopalakrishnan ............. 365/163 |
| 7,400,528 | B2 * | 7/2008 | Happ et al. ............... 365/185.03 |
| 7,436,694 | B2 * | 10/2008 | Berthold et al. ............... 365/148 |

(Continued)

FOREIGN PATENT DOCUMENTS

| JP | 2012038393 A | 2/2012 |
| WO | WO-2013142208 A1 | 9/2013 |

OTHER PUBLICATIONS

Russo, Ugo, et al., "Study of Multilevel Programming in Programmable Metallization Cell (PMC) Memory", IEEE Transactions on Electron Devices, vol. 56, No. 5, (May 2009), 1040-1047.

(Continued)

*Primary Examiner* — Viet Q Nguyen
(74) *Attorney, Agent, or Firm* — Schwegman, Lundberg & Woessner, P.A.

(57) ABSTRACT

Various embodiments comprise apparatuses having a number of memory cells including drive circuitry to provide signal pulses of a selected time duration and/or amplitude, and an array of resistance change memory cells electrically coupled to the drive circuitry. The resistance change memory cells may be programmed for a range of retention time periods and operating speeds based on the received signal pulse. Additional apparatuses and methods are described.

40 Claims, 6 Drawing Sheets

(56) References Cited

U.S. PATENT DOCUMENTS

| | | |
|---|---|---|
| 7,508,707 B2 | 3/2009 | Nakai et al. |
| 7,646,625 B2 * | 1/2010 | Philipp et al. ................. 365/148 |
| 7,796,449 B2 | 9/2010 | Willer et al. |
| 7,852,657 B2 * | 12/2010 | Happ et al. .................... 365/148 |
| 7,995,381 B2 * | 8/2011 | Nirschl et al. ................ 365/163 |
| 8,134,194 B2 * | 3/2012 | Mouli ........................... 257/296 |
| 8,467,227 B1 * | 6/2013 | Jo ................................. 365/148 |
| 8,488,366 B2 * | 7/2013 | Kurosawa et al. ............ 365/148 |
| 2006/0002174 A1 | 1/2006 | Hosoi et al. |
| 2007/0053224 A1 | 3/2007 | Happ et al. |
| 2007/0274120 A1 * | 11/2007 | Pinnow et al. ................ 365/148 |
| 2010/0058018 A1 | 3/2010 | Kund et al. |
| 2010/0128508 A1 | 5/2010 | Maejima |
| 2010/0188885 A1 | 7/2010 | Toda et al. |
| 2012/0014164 A1 | 1/2012 | Kamoshida et al. |
| 2012/0033512 A1 | 2/2012 | Takase |

OTHER PUBLICATIONS

"International Application U.S. Appl. No. PCT/US2013/030998, International Search Report mailed Jun. 24, 2013", 3 pgs.

"International Application U.S. Appl. No. PCT/US2013/030998, Written Opinion mailed Jun. 24, 2013", 10 pgs.

* cited by examiner

MULTI-FUNCTION RESISTANCE CHANGE MEMORY CELLS AND APPARATUSES INCLUDING THE SAME

BACKGROUND

Computers and other electronic systems, for example, digital televisions, digital cameras, and cellular phones, often have one or more memory devices to store information. Increasingly, memory devices are being reduced in size to achieve a higher density of storage capacity. However, memory devices also need to meet lower power requirements while maintaining high speed access.

DETAILED DESCRIPTION

Figure 1:
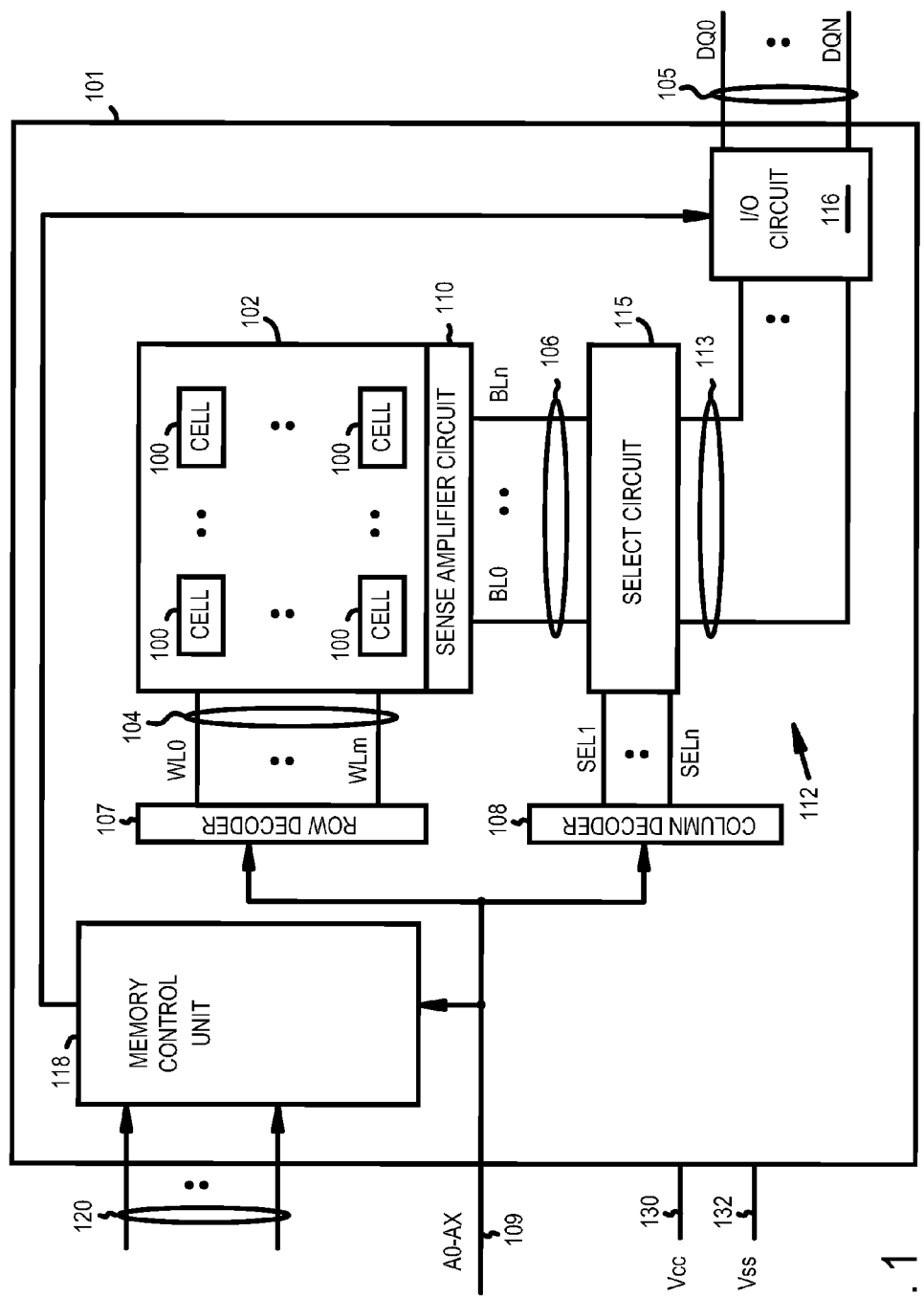
FIG. 1 shows a block diagram of a memory device having a memory array with memory cells, according to an embodiment.

The description that follows includes illustrative apparatuses (circuitry, devices, structures, systems, and the like) and methods (e.g., processes, protocols, sequences, techniques, and technologies) that embody the inventive subject matter. In the following description, for purposes of explanation, numerous specific details are set forth in order to provide an understanding of various embodiments of the inventive subject matter. It will be evident, however, to those skilled in the art that various embodiments of the inventive subject matter may be practiced without these specific details. Further, well-known apparatuses and methods have not been shown in detail so as not to obscure the description of various embodiments.

As used herein, the term "or" may be construed in an inclusive or exclusive sense. Additionally, although various exemplary embodiments discussed below may primarily focus on two-state (e.g., SLC) memory devices, the embodiments are merely given for clarity of disclosure, and thus, are not limited to apparatuses in the form of SLC memory devices or even to memory devices in general. As an introduction to the subject, a few embodiments will be described briefly and generally in the following paragraphs, and then a more detailed description, with reference to the figures, will ensue.

Emerging memory technologies may be utilized based on the intrinsic characteristics of an advanced memory device, rather than to attempt to force the device to behave, for example, as a flash memory or random access memory. In various embodiments described herein, managing the memory operations of an advanced memory device from an abstracted interface entails novel operation schemes.

Various embodiments enable a managed memory solution that capitalizes on the characteristics of an advanced memory device. For example, a resistance change memory cell (RCM) memory device (e.g., including devices such as a programmable metallization cell) exhibits data retention characteristics that depend on the amplitude and time duration of a signal pulse (e.g., a voltage or current signal). As will become apparent, differentiated memory function types may be managed on a single chip. In some embodiments, all electrical routing is within a single chip, so that through-silicon vias (TSVs) and critical alignment between adjacent chips are no longer required. In addition, latency may be reduced on a single chip implementation, as compared with fabricating a system over multiple chips.

In various embodiments, an apparatus is provided that includes a number of resistance change memory (RCM) cells. The apparatus includes a first region of the RCM cells, a second region of the RCM cells, and drive circuitry to selectively provide one of a plurality of signal pulse types to the first region of the RCM cells and to selectively provide a different one of the plurality of signal pulse types to the second region of the RCM cells. Each of the plurality of signal pulse types have a different attribute and corresponding to a different memory function type In at least some of embodiments of the apparatus, the attribute comprises an integration of a pulse amplitude and a pulse time duration.

In various embodiments, an apparatus is provided that includes a number of memory regions; each of the memory regions having a respective number of resistance change memory cells. A control and select circuitry is to determine a memory function type to emulate for information to be stored in the apparatus. The control and select circuitry further to select one of the memory regions in which to store the information. Drive circuitry is to provide to the selected one of the memory regions a pulse configured to emulate the determined memory function type for the information.

In some embodiments of the apparatus, the memory regions, the control and select circuitry, and the drive circuitry are all formed on a single die. In some embodiments of the apparatus, the drive circuitry is to provide a pulse having an amplitude and time duration configured to emulate the determined memory function type. In some embodiments of the apparatus, each of the first and second drive circuits is configured to match a respective power requirement of the first memory region and the second memory region, respectively.

In various embodiments, a method is provided that includes determining one of a plurality of memory function types to emulate, and applying a programming pulse, having an attribute configured to emulate the determined memory function type, to a selected one of the RCM cells.

In various embodiments, an apparatus is provided that includes a resistance change memory (RCM) cell and drive circuitry electrically coupled to the RCM cell to provide a signal pulse. The signal pulse is configurable in both amplitude and time duration to vary a data retention time of the RCM cell.

In some embodiments of the apparatus, the signal pulse is configurable to vary a localized conduction region formed within the RCM cell to emulate a selected one of a plurality of memory function types. In some embodiments of the apparatus, the drive circuitry is configured to vary the time duration of the signal pulse to vary the data retention time of the RCM cell. In some embodiments of the apparatus, the drive circuitry is configured to vary the amplitude of the signal pulse to vary the data retention time of the RCM cell. In some embodiments of the apparatus, the drive circuitry is configured to provide a sequence of pulses to vary the data retention time of the RCM cell.

In various embodiments, a method of operating a memory device is provided. The method includes selecting one of a plurality of memory function types to emulate within the memory device, selecting an energy level per memory cell to be provided in a signal pulse to emulate the selected memory function type, and applying the signal pulse to a memory cell of the memory device In some embodiments of the method, the selected energy level corresponds to a state of a localized conduction region within the memory cell. In some embodiments of the method, selecting the energy level per memory cell comprises selecting a time duration of the signal pulse. In some embodiments of the method, selecting the energy level per memory cell comprises selecting an amplitude of the signal pulse. In some embodiments of the method, selecting the energy level comprises selecting a current delivered to the memory cell over a duration of the signal pulse. In some embodiments of the method, selecting the energy level comprises selecting a current compliance.

In various embodiments, a method of operating a memory device is provided. The method includes determining a retention period needed for information to be stored in the RMC cell and varying an amount of power consumed to program the RCM cell depending upon the determined retention period.

In various embodiments, a method of operating a memory device is provided. The method includes determining a endurance level needed for information to be stored in the RMC cell and varying an amount of power consumed to program the RCM cell depending upon the determined endurance level.

In various embodiments, a method of operating a memory device is provided. The method includes determining an operating speed needed for information to be stored in the RMC cell and varying an amount of power consumed to program the RCM cell depending upon the determined operating speed.

In various embodiments, a memory device is provided that includes a first group of RMC cells emulating a first memory type function and a second group of RMC cells emulating a second memory type function. The first group of RMC cells and the second group of RMC cells are formed on a single integrated circuit Referring now to FIG. 1, a block diagram of an apparatus in the form of a memory device 101 is shown. The memory device 101 includes one or more memory arrays 102 having a number (e.g., one or more) of memory cells 100 according to an embodiment. The memory cells 100 can be arranged in rows and columns along with access lines 104 (e.g., wordlines to conduct signals WL0 through WLm) and first data lines 106 (e.g., bit lines to conduct signals BL0 through BLn). The memory device 101 can use the access lines 104 and the first data lines 106 to transfer information to and from the memory cells 100. A row decoder 107 and a column decoder 108 decode address signals A0 through AX on address lines 109 to determine which ones of the memory cells 100 are to be accessed.

Sense circuitry, such as a sense amplifier circuit 110, operates to determine the values of information read from the memory cells 100 in the form of signals on the first data lines 106. The sense amplifier circuit 110 can also use the signals on the first data lines 106 to determine the values of information to be written to the memory cells 100.

The memory device 101 is further shown to include circuitry 112 to transfer values of information between the memory array 102 and input/output (I/O) lines 105. Signals DQ0 through DQN on the I/O lines 105 can represent values of information read from or to be written into the memory cells 100. The I/O lines 105 can include nodes of the memory device 101 (e.g., pins, solder balls, or other interconnect technologies such as controlled collapse chip connection (C4), or flip chip attach (FCA)) on a package where the memory device 101 resides. Other devices external to the memory device 101 (e.g., a memory controller or a processor, not shown in FIG. 1) can communicate with the memory device 101 through the I/O lines 105, the address lines 109, or the control lines 120.

The memory device 101 can perform memory operations, such as a read operation, to read values of information from selected ones of the memory cells 100 and a programming operation (also referred to as a write operation) to program (e.g., to write) information into selected ones of the memory cells 100. The memory device 101 can also perform a memory erase operation to clear information from some or all of the memory cells 100.

A memory control unit 118 controls memory operations using signals on the control lines 120. Examples of the signals on the control lines 120 can include one or more clock signals and other signals to indicate which operation (e.g., a programming or read operation) the memory device 101 can or should perform. Other devices external to the memory device 101 (e.g., a processor or a memory controller) can control the values of the control signals on the control lines 120. Specific combinations of values of the signals on the control lines 120 can produce a command (e.g., a programming, read, or erase command) that can cause the memory device 101 to perform a corresponding memory operation (e.g., a program, read, or erase operation).

Although various embodiments discussed herein use examples relating to a single-bit memory storage concept for ease in understanding, the inventive subject matter can be applied to numerous multiple-bit schemes as well. For example, each of the memory cells 100 can be programmed to a different one of at least two data states to represent, for example, a value of a fractional bit, the value of a single bit or the value of multiple bits such as two, three, four, or a higher number of bits.

For example, each of the memory cells 100 can be programmed to one of two data states to represent a binary value of "0" or "1" in a single bit. Such a cell is sometimes called a single-level cell (SLC).

In another example, each of the memory cells 100 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to one of more than two data states is sometimes referred to as a multi-level cell (MLC). Various operations on these types of cells are discussed in more detail, below.

The memory device 101 can receive a supply voltage, including supply voltage signals $V_{cc}$ and $V_{ss}$, on a first supply line 130 and a second supply line 132, respectively. Supply voltage signal $V_{ss}$ can, for example, be at a ground potential (e.g., having a value of approximately zero volts). Supply voltage signal $V_{cc}$ can include an external voltage supplied to the memory device 101 from an external power source such as a battery or alternating-current to direct-current (AC-DC) converter circuitry (not shown in FIG. 1).

The circuitry 112 of the memory device 101 is further shown to include a select circuit 115 and an input/output (I/O) circuit 116. The select circuit 115 can respond to signals SEL1 through SELn to select signals on the first data lines 106 and the second data lines 113 that can represent the values of information to be read from or to be programmed into the memory cells 100. The column decoder 108 can selectively activate the SEL1 through SELn signals based on the A0 through AX address signals on the address lines 109. The select circuit 115 can select the signals on the first data lines 106 and the second data lines 113 to provide communication between the memory array 102 and the I/O circuit 116 during read and programming operations.

The memory device 101 may comprise a non-volatile memory device and the memory cells 100 can include non-volatile memory cells such that the memory cells 100 can retain information stored therein when power (e.g., $V_{cc}$, $V_{ss}$, or both) is disconnected from the memory device 101.

Each of the memory cells 100 can include a memory element having material, at least a portion of which can be programmed to a desired data state (e.g., by being programmed to a corresponding resistance state). Different data states can thus represent different values of information programmed into each of the memory cells 100.

The memory device 101 can perform a programming operation when it receives (e.g., from an external processor or a memory controller) a programming command and a value of information to be programmed into one or more selected ones of the memory cells 100. Based on the value of the information, the memory device 101 can program the selected memory cells to appropriate data states to represent the values of the information to be stored therein.

One of ordinary skill in the art may recognize that the memory device 101 may include other components, at least some of which are discussed herein. However, several of these components are not shown in the figure, so as not to obscure details of the various embodiments described. The memory device 101 may include devices and memory cells, and operate using memory operations (e.g., programming and erase operations) similar to or identical to those described below with reference to various other figures and embodiments discussed herein.

Figure 2:
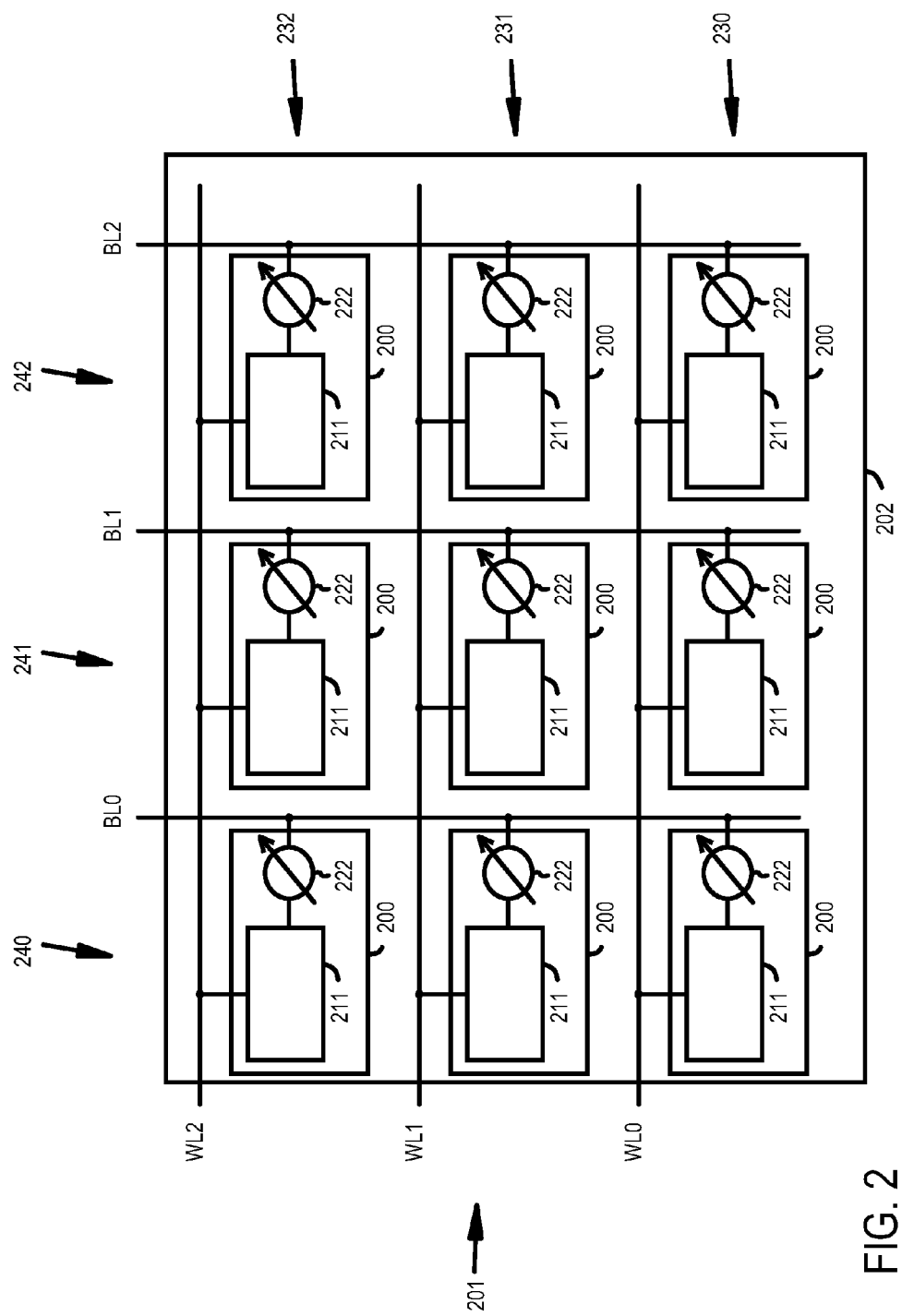
FIG. 2 shows a partial block diagram of a memory device having a memory array including memory cells with access components and memory elements, according to an embodiment.

With reference now to FIG. 2, a partial block diagram of an apparatus in the form of a memory device 201 is shown to include a memory array 202, including memory cells 200 with access components 211 and memory elements 222, according to an example embodiment. The memory array 202 may be similar or identical to the memory array 102 of FIG. 1. As further shown in FIG. 2, the memory cells 200 are shown to be arranged in a number of rows 230, 231, 232, along with access lines, for example word lines, to conduct signals such as signals WL0, WL1, and WL2. The memory cells are also shown to be arranged in a number of columns 240, 241, 242 along with data lines, for example bit lines, to conduct signals such as signals BL0, BL1, and BL2. The access components 211 can turn on (e.g., by using appropriate values of signals WL0, WL1, and WL2) to allow access to the memory elements 222, such as to operate the memory elements as pass elements, or to read information from or program (e.g., write) information into the memory elements 222.

Programming information into the memory elements 222 can include causing the memory elements 222 to have specific resistance states. Thus, reading information from a memory cell 200 can include, for example, determining a resistance state of the memory element 222 in response to a specific voltage being applied to its access component 211. In either case, such a determining act may involve sensing a current (or absence of current) flowing through the memory cell 200 (e.g., by sensing a current of a bit line electrically coupled to the memory cell). Based on a measured value of the current (including, in some examples, whether a current is detected at all), a corresponding value of the information stored in the memory can be determined. The value of information stored in a memory cell 200 can be determined in still other ways, such as by sensing a voltage of a bit line electrically coupled to the memory cell.

Figure 3:
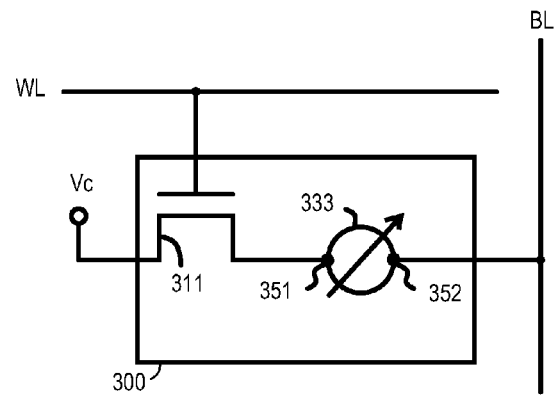
FIG. 3 shows a schematic diagram of a memory cell having an access component coupled to a memory element, according to various embodiments.

FIG. 3 shows a schematic diagram of a memory cell 300 having an access component 311 coupled to a memory element 333, according to various embodiments. Lines labeled WL and BL in FIG. 3 may correspond to any one of the access lines 104 and any one of the first data lines 106 of FIG. 1, respectively. FIG. 3 shows an example of the access component 311 including, for example, a metal-oxide-semiconductor field-effect transistor (MOSFET). As will be realized by a person of ordinary skill in the art, upon reading this disclosure, the memory cell 300 can include other types of access components, such as diodes, for example, or may not include any access component, such as in the case of some cross-point arrays.

The memory element 333 may be coupled to and disposed between two electrodes, such as a first electrode 351 and a second electrode 352. FIG. 3 schematically shows these electrodes as dots. Structurally, each of these electrodes can include conductive material. The memory element 333 can include material that can be changed, for example, in response to a signal, to have a different resistance state. The value of information stored in the memory element can correspond to the resistance state of the memory element. The access component 311 can enable signals (e.g., embodied as a voltage or current) to be transferred to and from the memory element 333 via the pairs of electrodes during operation of the memory cell, such as during read, program, or erase operations.

A programming operation may use signal WL to turn on the access component 311 and then apply a signal BL (e.g., a signal having a programming voltage or current) through the memory element 333. Such a signal can cause at least a portion of the material of the memory element 333 to change. The change can be reversed by, for instance, performing an erase operation. For example, a localized conductive region may be formed within an electrolyte contained within the memory element 333. The formation of the localized conductive region is discussed in more detail, below, for example, with reference to FIGS. 5A through 5C. The lateral size of the localized conductive region can determine the resistance state of the memory cell, where different resistance states correspond to different data states that represent different values of information stored in the memory element 333. The physical characteristics of the localized conductive region, and hence the memory characteristics of the cell, depend on the attributes of the signal pulse that is used to "set" the cell. For example, a lower energy pulse may form a "weaker" (e.g., thinner and/or shorter) conductive region that is lower in conductance, and retains the associated resistance state for only a short duration. In this case, the lower energy pulse provides a low-power, short-term memory function. In comparison, a higher energy pulse may form a "stronger" (e.g., thicker and/or taller) localized conductive region that is higher in conductance, and exhibits longer-term memory retention. In yet another example, a very fast, high power pulse may provide a conductive region that is only retained temporarily. In this case, the memory function may be considered volatile and function in a manner analogous to DRAM. Any of the prescribed memory functions be utilized in conjunction with other memory cells (e.g., regions of memory cells), that furnish differentiated memory functions, based on their program signal attributes.

A read operation may use the signal WL to turn on the access component 311 (or otherwise access the memory cell) and then apply a signal BL having a voltage or a current (e.g., a read voltage or current) through the memory element 333. The read operation may measure the resistance of the memory cell 300, based on a read voltage or current, to determine the corresponding value of information stored therein. For example, in the memory cell 300, a different resistance state can impart a different value (e.g., voltage or current value) to signal BL when a read current passes through the memory elements 333. Other circuitry of the memory device (e.g., a circuit such as the I/O circuit 116 of FIG. 1) can use the signal BL to measure the resistance state of memory element 333 to determine the value of the information stored therein.

The voltage or current used during a read, program, or erase operation can be different from one another. For example, in a programming operation, the value (e.g., the voltage) of the signal (e.g., the signal BL in FIG. 3) that creates a current flowing through the memory element can be sufficient to cause the material or at least a portion of the memory element to change. The change can alter the resistance state of the memory element to reflect the value of the information to be stored in the memory element 333.

In a read operation, the value (e.g., the voltage) of the signal (e.g., the signal BL in FIG. 3) that creates a current flowing through the memory element can be sufficient to create the current but insufficient to cause any portion of the memory element to change. Consequently, the value of the information stored in the memory element can remain unchanged during and after the read operation. Other embodiments may require "refresh" operations, for example volatile memory function such as DRAM.

In an erase operation, the voltage value of the signal (e.g., the signal BL in FIG. 3) can have an opposite polarity from the voltage used in a programming operation. The signal, creating a current in this case, can therefore change, or reset, the material of the memory element to its original state; for example, a state prior to any programming being performed on the memory cell.

Various ones or all of the memory cells 100, 200, 300 of FIGS. 1 through 3 can include a memory cell having a structure similar or identical to one or more of the memory cells described below.

Figure 4:
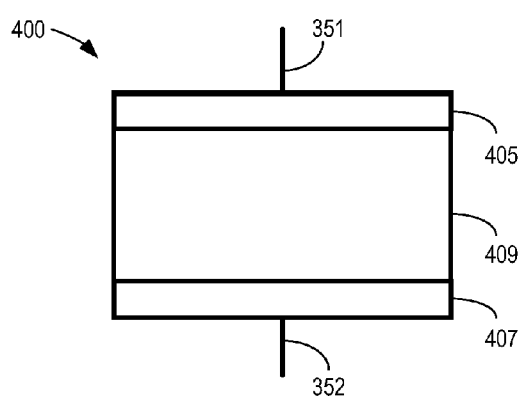
FIG. 4 is a simplified schematic block diagram of one of several resistance change memory cell (RCM) memory elements that may be used with the memory devices of FIGS. 1 and 2, or may comprise the memory cell of FIG. 3.

For example, FIG. 4 shows is a simplified schematic block diagram of one of several memory cells that may be used with the memory devices of FIGS. 1 and 2, and may be similar to or identical to the memory element 333 of FIG. 3. That is, the memory cell 300 may comprise a resistance change memory cell (RCM) 400. The RCM 400 includes the type of cell known as a conductive-bridging RAM (CBRAM) memory cell. As described in further detail below, an operation of the RCM 400 is based on a voltage-driven ionic migration and electrochemical deposition of metal ions within a solid electrolyte 409 of the RCM 400.

Prior to any signal (e.g., a bias voltage) being applied to the anode 405 and the cathode 407, the basic construction of the RCM 400 is that of a metal-insulator-metal structure. Therefore, prior to any voltage being applied to the anode 405, the RCM 400 can be considered to be in a "reset" (e.g., native) state. The reset state is a high-resistance state due to the natural insulative (i.e., electrically non-conductive) nature of the solid electrolyte 409. As discussed in more detail with reference to FIGS. 5A through 5C, below, by applying, for example, a positive voltage to an anode 405 of the RCM 400, metal ions are driven from the anode 405, through the solid electrolyte 409, and towards a cathode 407.

The anode 405 may be, for example, an oxidizable, fast diffusing metallic or metallic alloy layer. The anode 405 may be comprised of various types of electrochemically active metals or metal alloys. In a specific example, the anode 405 may comprise silver (Ag), copper (Cu), Aluminum (Al), or zinc (Zn) and functions as a metallic ion donor. The cathode 407 may be a relatively inert material comprising a semiconducting or metallic material that does not possess a significant solubility or a significant mobility to provide ions to the solid electrolyte 409. In a specific example, the cathode 407 may comprise platinum (Pt), tungsten (W), titanium (Ti), tantalum (Ta), titanium nitride (TiN), or doped silicon (Si), tantalum nitride (TaN). The electrolyte may be a chalcogenide, for example, silver-doped germanium selenide (Ag—GeSe), silver-doped germanium sulfide (Ag—$GeS_2$), copper-doped germanium sulfide (Cu—$GeS_2$), or copper telluride ($CuTe_x$); or an oxide, e.g. a transition metal oxide (e.g., $ZrO_x$), a semiconductor oxide (e.g., $SiO_x$), a rare earth oxide (e.g., $YbO_x$), an other metal oxide (e.g., $AlO_x$), or combinations thereof, (e.g., $ZrSiO_x$).

One advantage of the RCM 400 compared with more traditional memory technologies (e.g., flash memory) is that the RCM 400 offers potential for scaling to smaller technology nodes, and may be operated at comparatively low power for all operations (e.g., read, program, and erase). Also, these operations may be performed at a higher speed than traditional memory. For example, to increase the speed of operations, the RCM 400 may be programmed at a relatively low voltage, emulating a volatile memory type (e.g., random access memory (RAM)). The emulation of RAM requires less power but also has a limited data retention life. The data retention life may be increased by applying a higher voltage and/or higher current compliance) signal for a longer time period. The emulation of various memory types, along with programming/erase (P/E) voltages, and application of voltage pulse times and compliance currents, are discussed in more detail, below.

Figures 5A, 5B, 5C:
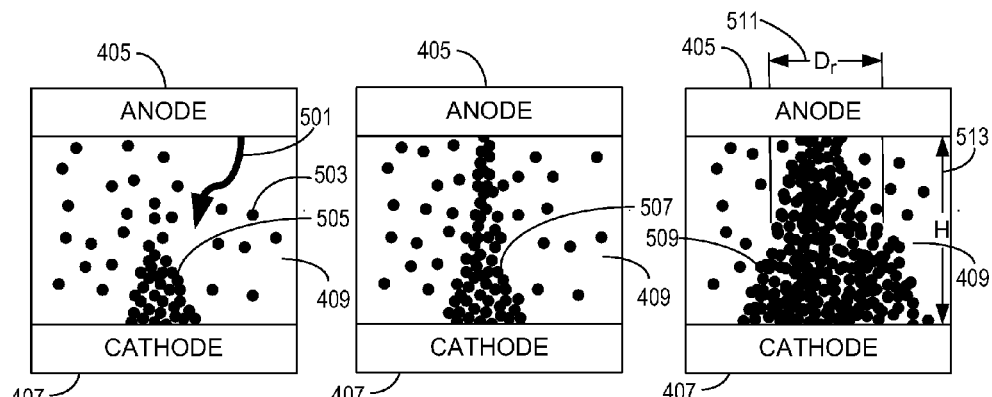
FIGS. 5A through 5C show a schematic representation of ionic migration and localized conductive region formation and growth of a RCM.

With reference to FIGS. 5A through 5C, a schematic representation of ionic migration and localized conductive region formation and growth is shown. In FIG. 5A, a minimum reaction activation energy 501 (e.g., the reaction energy necessary to overcome an inherent energy barrier) may be supplied by a positive voltage applied to the anode 405. The positive voltage produces and drives metallic ions 503 from the anode 405, through the solid electrolyte 409, and toward the cathode 407. The metallic ions 503 deposit on the cathode 407 and may be electrochemically reduced to form a highly-conductive metal-rich deposit. The electrodeposit may continue to grow as the metallic ions 503 continue to migrate from the anode 405 toward the cathode 407, as long as the positive voltage is applied to the anode 405. A small localized conductive region 505 deposited on the cathode 407 alters at least one of the electrical resistance and the electron tunneling current across the junction. The small localized conductive region 505, in conjunction with the metallic ions 503 in the solid electrolyte 409, increases the current sensed across the RCM of FIG. 5A as compared with the RCM 400 of FIG. 4, which is considered to be in a reset state since no voltage has yet been applied.

In FIG. 5B, as the positive voltage is maintained on the anode 405, the metallic ions 503 continue to deposit and the localized conductive region continues to grow. The localized conductive region grows away from the cathode 407 and begins approaching the anode 405, forming an enlarged localized conductive region 507. Either the small localized conductive region 505 of FIG. 5A or the enlarged localized conductive region 507 of FIG. 5B may not be a continuous metallic structure but may instead be a chain of metal-rich islands. A higher-amplitude programming signal or a longer duration of the programming pulse may produce a larger localized conductive region 509 as indicated by FIG. 5C.

With reference to FIG. 5C, with a continuing application of positive voltage to the anode 405, a larger localized conductive region 509 is formed, eventually bridging the distance, H, 513, between the cathode 407 and the anode 405. By continual application of the voltage signal, the larger localized conductive region 509 also continues to grow radially as indicated by an approximation of the full-width and half-maximum (FWHM) diameter, $D_r$, 511 of the larger localized conductive region 509. Since the larger localized conductive region 509 bridges the distance, H, 513 from the cathode 407 to the anode 405, the RCM of FIG. 5C has a lower-resistance state (i.e., a higher-conductivity value) than the RCM of FIG. 5B having the enlarged localized conductive region 507. In turn, the enlarged localized conductive region 507 produces a RCM with a lower-resistance state than the RCM of FIG. 5A that has the small localized conductive region 505. The RCM of FIG. 5A, in turn, has a lower-resistance state than the RCM 400 of FIG. 4, which is in a reset state.

To erase the RCM 400, a positive bias signal (positive with respect to the anode 405) may be applied to the cathode 407. The electrochemical process is reversed, and the electro deposit is oxidized. Metallic ions 503 then migrate away from the cathode 407, through the solid electrolyte 409, back toward the anode 405. The migration of the metallic ions 503 breaks down the localized conductive region and the resistance of the RCM 400 increases. Breaking down the localized conductive region returns the RCM 400 to a reset state. Thus, the stored data content of the RCM 400 may be defined by the respective resistance between the anode 405 and the cathode 407. Thus, the reverse polarity signal (i.e., the positive bias on the cathode) can also be used to operate the device to different states of resistance.

In addition to an ability to emulate various memory function types (e.g., volatile, non-volatile, high-speed, low-power, high-endurance, etc.), the RCM 400 of FIG. 4 offers a resistive switching effect over several orders of magnitude. Thus, multi-level memory programming is possible by programming the RCM 400 to different resistance states. For example, a first data state can be achieved by programming (or erasing) the RCM 400 to a high-resistance (low-conductivity) state (e.g., a "1" or reset state). A second data state can be achieved by programming the RCM 400 to a low-resistance (high-conductivity) state (e.g., a "0" or set state). A difference in the resistance states may be based on a variation of the concentration of the metallic atoms either bridging the anode 405 and the cathode 407 with a localized conductive region, or the localized conductive region being reduced in size or absent within the solid electrolyte 409. To read the value of data stored within the RCM 400, the access component 311 of the memory cell 300 (see FIG. 3) is switched on and a small signal, for example a voltage signal, is applied across the RCM 400. If a localized conductive region has been formed, a resistance measured across the cell becomes relatively small. If no localized conductive region is formed, the resistance will be higher. Consequently, the RCM can be considered to be a variable resistance device where each resistance state (e.g., a range of resistance values) corresponds to a different data state.

The incremental growth of the localized conductive region, and resulting decrease in resistance, can be controlled by at least two factors. With reference to Table I, below, increasing the applied voltage may increase the growth (both initially in height, H, and radial growth, $D_r$) of the localized conductive region, as well as increase speed. Further, applying a voltage across the anode 405 and the cathode 407 for a longer time period may also increase the growth of the localized conductive region. Further, the voltage can be applied in separate pulses. For example, rather than applying a single 100 nA pulse at 5.0 V, several-20 nA pulses at 5.0 V may be applied subsequently and may produce a similar effect on the localized conductive region growth. The current compliance is provided as an example of an external current limit for various resistance states during reading, programming, and erasing. For example, if the current through the RCM 400 is too great, Joule-heating effects may destroy the localized conductive region.

TABLE I

Example operating ranges for differentiated memory functions. Actual operating ranges depend on device specifics, such as material composition, film thicknesses, and fabrication process conditions.

| Memory Function Type | P/E Voltage (V) | P/E Pulse Duration | Current Compliance (Set/Reset) | LRS/HRS | Retention (sec) |
|---|---|---|---|---|---|
| Volatile Memory | 0.5-3.0 | 1 ns-20 ns | 10 nA-1 µA | 1 MΩ/1 GΩ | 1e0-1e2 |
| Storage Class Memory | 1.0-5.0 | 100 ns-10 µs | 100 nA-100 µA | 1 MΩ/1 GΩ | 1e4-1e7 |
| Storage Memory | 1.0-5.0 | 1 µs-100 µs | 10 µA-100 µA | 100 kΩ/1 GΩ | 1e7-1e8 |
| OTP Memory | 3.0-5.0 | 100 µs-100 ms | >100 µA | ~1 kΩ/NA | >1e8 |

While different applications of voltage and time can be selected to produce different resistance states of the RCM 400 of FIG. 4, the different voltages and times may be used to emulate different types of memory as well. For example, shorter pulses at a lower voltage applied to the RCM 400 can be used to emulate volatile memory (e.g., random access memory). The shorter pulse and lower voltage and current lowers overall power usage. However, the retention time period for the data stored will be short. If longer data retention is needed, a periodic voltage pulse refresh may be required to preserve the stored data beyond approximately a few seconds. Applying either a higher voltage or the same voltage for a longer duration, or both, can be used to emulate storage class memories (e.g., phase change memory (PCM) and magnetic RAM (MRAM)) or storage memory (e.g., disk drives). The storage class memory stored in this way can be preserved for weeks or months without a refresh voltage pulse. In some embodiments, the storage memory may be preserved for several years without a refresh pulse. By applying either an even higher voltage to the RCM, or applying the voltage pulse for a longer duration, or both, the RCM can emulate a one-time programmable (OTP) memory (e.g., read-only memory) type. In some embodiments, the OTP-emulated memory may be stored for 20 years or more without a periodic refresh pulse. For each of the memory function types, example resistances are provided for a range of a low resistance state (LRS) to a high resistance state (HRS). In various embodiments, a minimum of a ten-times ratio between HRS & LRS may be chosen. The example resistances may be used during a read operation of the RCM to determine a data state.

Each of the voltages, pulse durations, and current compliance settings can vary with device geometry. Different geometries and design rules may involve the use of higher or lower voltages and currents, and longer or shorter pulse durations, at higher or lower current compliances, which may result in longer or shorter retention periods. For example, forming a RCM having a solid electrolyte with a taller height, H (see FIG. 5C), may utilize a higher voltage and/or longer pulse duration to program the RCM for a given memory function. However, the retention period may also be longer without a refresh. Similarly, forming a RCM having a solid electrolyte with a shorter height, H (see FIG. 5C), may utilize a lower voltage and/or shorter pulse duration to program the RCM for a given memory function. However, the retention period may also be shorter, calling for the use of more frequent periodic refresh pulses.

Further, although only four memory function types are shown in Table I, a person of ordinary skill in the art, upon reading and understanding the disclosure provided herein, will understand that many other memory function types (where the term "memory function types" encompasses sub-function types) may be possible. The emulation of additional memory function types is possible due to the trade-offs between programming power, retention, and cycling endurance.

Thus, the programming speed can be accelerated by increasing the voltage or decreasing the pulse width of the voltage pulse applied across the RCM 400. The amount of power consumed to program a RCM may be varied depending upon a given retention period needed for a particular set or sets of data. This can be due to the apparent voltage-time equivalence within this class of memory devices: regions of memory cells allocated for "faster" operation may require higher voltage operation and more frequent refresh due to shorter retention. Other regions of memory cells allocated for "longer-term" memory operations may require longer pulse widths, for a given voltage, and thus may operate at "slower" speeds.

Figure 6:
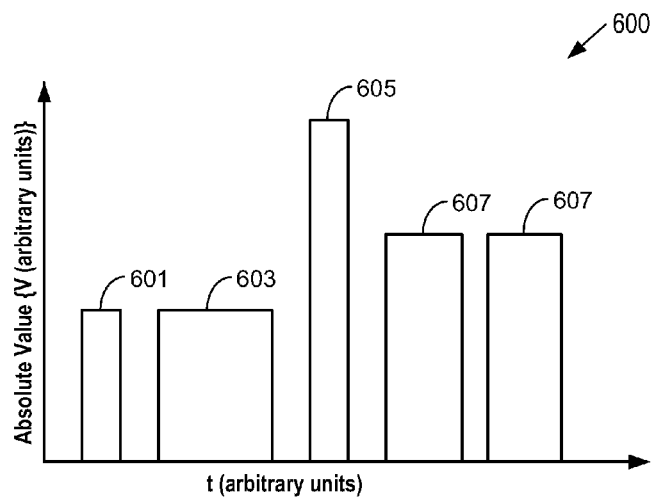
FIG. 6 is a voltage-time graph showing a number of programming/erase pulses.

With reference now to the example of a voltage-time graph 600 of FIG. 6, a number of pulses are shown. The pulses are shown as an absolute value of voltage as a function of time. Since the same amplitude and duration of pulse may be employed for either programming or erase operations in accordance with Table I, the amplitude of voltage is shown as an absolute value. For example, if a positive voltage is applied to the anode 405 of FIG. 4 (positive relative to the cathode 407), then a localized conductive region within the RCM 400 is either formed or grown and the resistance of the RCM 400 decreases. Thus, the RCM 400 is in a program mode of operation. If a negative voltage is applied to the anode 405, then the localized conductive region begins to break down, thereby increasing the resistance of the RCM 400. The RCM 400 is therefore in an erase mode of operation.

A person of ordinary skill in the art, upon reading the disclosure provided herein, will recognize that the nomenclature for program and erase modes of operation is somewhat arbitrary and may be reversed. For example, a data value of "0" can either be considered as being either a high-resistance state or a low-resistance state of the RCM 400. Similarly, a data value of "1" can either be considered as being either a low-resistance state or a high-resistance state of the RCM 400, as long as it is the opposite resistance state of the data "1" value.

Therefore, a data state for any of the states may be programmed or erased by a number of signal pulses. For the continuing discussions, below, reference will be made only to the programming pulses. A person of ordinary skill in the art will understand, based on the discussion provided herein, that a similar understanding of the description applies to an erase operation as well.

For example, with concurrent reference to Table I and continuing reference to FIG. 6, a first pulse 601 has a relatively low-amplitude with a relatively short duration. The first pulse 601 may be sufficient to begin formation of a small localized conductive region 505 within the RCM 400 (e.g., see FIG. 5A). The small localized conductive region 505 lowers the resistance of the RCM 400 from a reset state and may allow the RCM 400 to emulate a volatile memory function type due to the low-amplitude and short-duration of the pulse.

A second pulse 603 has approximately the same amplitude as the first pulse 601 but has a longer duration. Therefore, the second pulse 603 may be sufficient to provide a higher conductance (e.g., an enlarged portion) of the enlarged localized conductive region 507 within the RCM 400 (e.g., see FIG. 5B). The enlarged localized conductive region 507 lowers the resistance of the RCM 400 even farther from the reset state and may allow the RCM 400 to emulate a storage class memory function type, and therefore an increased retention, due to the low-amplitude and longer-duration of the second pulse 603.

A third pulse 605 has a larger amplitude than either the first pulse 601 or the second pulse 603, but has a duration approximately the same as the first pulse 601. However, the increased amplitude of the third pulse 605 may still be sufficient to provide a higher conductance (e.g., a larger portion) of the larger localized conductive region 509 within the RCM 400 (e.g., see FIG. 5C). Like second pulse 603, the larger localized conductive region 509 lowers the resistance of the RCM 400 even farther from the reset state and may allow the RCM 400 to emulate a storage memory function type due to the high-amplitude and shorter-duration of the third pulse 605.

Alternatively, the increased amplitude may provide faster program and erase operations and may allow the RCM 400 to emulate a high-speed, volatile memory function analogous to DRAM.

As an alternative to the third pulse 605, a pair of pulses 607 may be sufficient to place the RCM 400 in the same state as the third pulse 605. Even though the amplitude of the pair of pulses 607 is less than that of the third pulse 605, the integration of voltage and time (i.e., Joules/Amp) may be approximately the same as is contained within the third pulse 605. Therefore, the pair of pulses 607 may still be sufficient to provide a higher conductance (e.g., an enlarged portion) of the larger localized conductive region 509 within the RCM 400.

Figure 7:
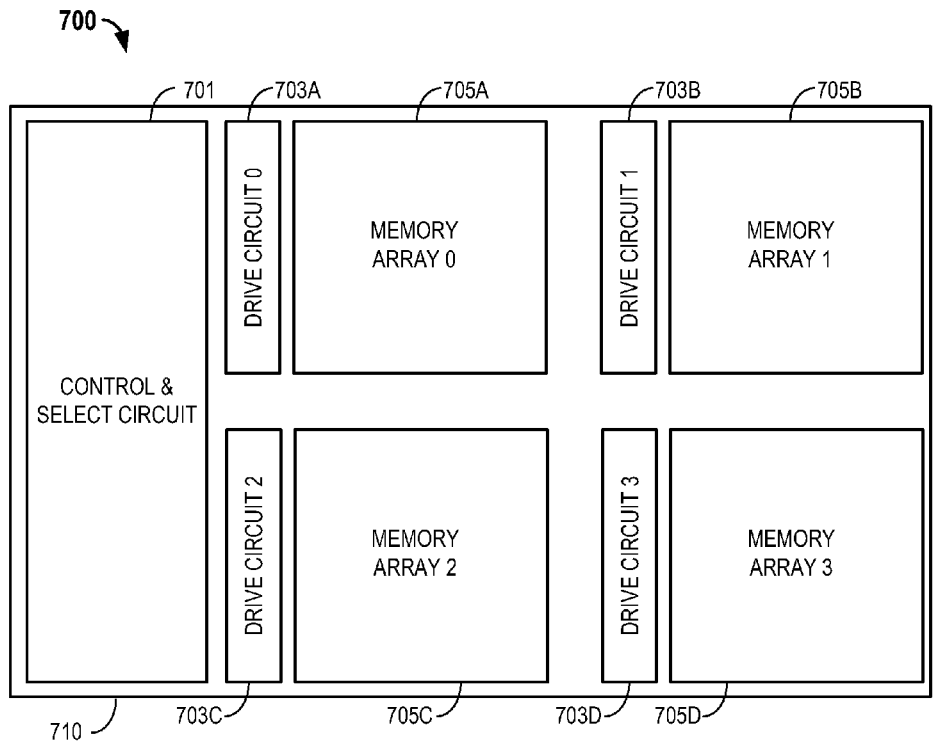
FIG. 7 shows an embodiment of a memory array circuit that may be used to implement variable resistance states and memory function types.

Referring now to FIG. 7, an embodiment of an apparatus in the form of a memory circuit 700 is shown to implement the variable resistance states and memory function types described herein. The memory circuit 700 can be formed on a single die 710 and is shown to include control and select circuitry 701, drive circuitry 703 (e.g., a plurality of drive circuits 703A, 703B, 703C, 703D), and a plurality of memory regions (e.g., memory arrays 705A, 705B, 705C, 705D). The control and select circuitry 701 may control memory operations based on signals of incoming control lines (e.g., the control lines 120 of FIG. 1). Examples of the signals on the control lines can include one or more clock signals and other signals to indicate which operation (e.g., a programming or read operation) is performed on a respective one or ones of the memory regions. Other devices external to the memory circuit 700 (e.g., a processor or a separate memory controller) can control the values of the control signals on the control lines. Specific combinations of values of the signals on the control lines can produce a command (e.g., a programming or read command) that can cause the memory circuit 700 to perform a corresponding memory operation (e.g., a program or read operation). The control and select circuitry 701 may interpret flag bits that an external controller might set to indicate what type of memory function is indicated for given data. The control and select circuitry 701 may also include column and row decoder circuitry.

Each of the plurality of memory arrays 705A, 705B, 705C, 705D may be used to emulate a specific (and perhaps different) memory function type. For example, the memory array 0 705A may comprise a group of RCMs to emulate a volatile memory function, the memory array 1 705B may comprise a group of RCMs to emulate a storage class memory function, the memory array 2 705C may comprise a group of RCMs to emulate a storage memory function, and the memory array 3 705D may comprise a group of RCMs to emulate a one-time programmable (OTP) memory function.

Commensurate with the function to be emulated, the plurality of memory arrays, the plurality of drive circuits may be configured to match the power requirements of a related memory array. For example, if the memory array 0 705A contains an array of RCMs to emulate volatile memory, then the drive elements within the drive circuit 0 703A may be sized smaller than drive circuits on other arrays since the power output requirements (e.g., the maximum voltages and current compliance levels) for volatile memory emulation are smaller than for other types of emulated memory function types. In other cases, the drive elements within the drive circuit 0 703A may be sized similarly or even larger than drive circuits on other arrays since the fast-operating volatile memory may utilize a short, high-voltage pulse in order to provide sufficient drift velocity to set the cell in the short time allotment.

Although there is no need to arrange the memory arrays into different physical locations, each emulating a specific memory function type, a designer of the circuit may find the physical layout of FIG. 7 to be advantageous for layout and design purposes. Further, the plurality of drive circuits 703A, 703B, 703C, 703D may be replicated by a single drive circuit where each drive element (e.g., a drive transistor) within the single drive circuit is capable of applying the entire range of voltage pulses (see Table I) within the current compliance level. However, by arranging the drive circuits to match a given memory array emulating a given memory function type, the physical size of the memory circuit 700 may be reduced. Consequently, the overall area for the memory circuit 700 may be reduced if all drive elements are not designed to cover a full power range.

Further, although the memory circuit 700 is shown to be formed as a single integrated circuit device (e.g., the single die 710), a person of ordinary skill in the art, upon reading and understanding the disclosure provide herein, will realize that various components of the memory circuit 700 may be arranged on separate integrated circuit devices. For example, each of the plurality of drive circuits may be physically located on an integrated circuit separate from the plurality of memory arrays.

Thus, different regions of the single die 710 may be operated for differentiated memory function types, based on applying different prescribed program signals (e.g., different pulse amplitudes and/or pulse widths), as described herein in order to obtain different retention and power characteristics. ☐Therefore, each region of the single die 710 may have corresponding transistor access devices in the drive circuitry 703 that are specifically designed to provide the different drive currents necessary for the differentiated memory function types. ☐All transistor access devices may be fabricated in the same layer or layers within the device, and all memory cells may be within the same layer or layers of the device.

Figure 8:
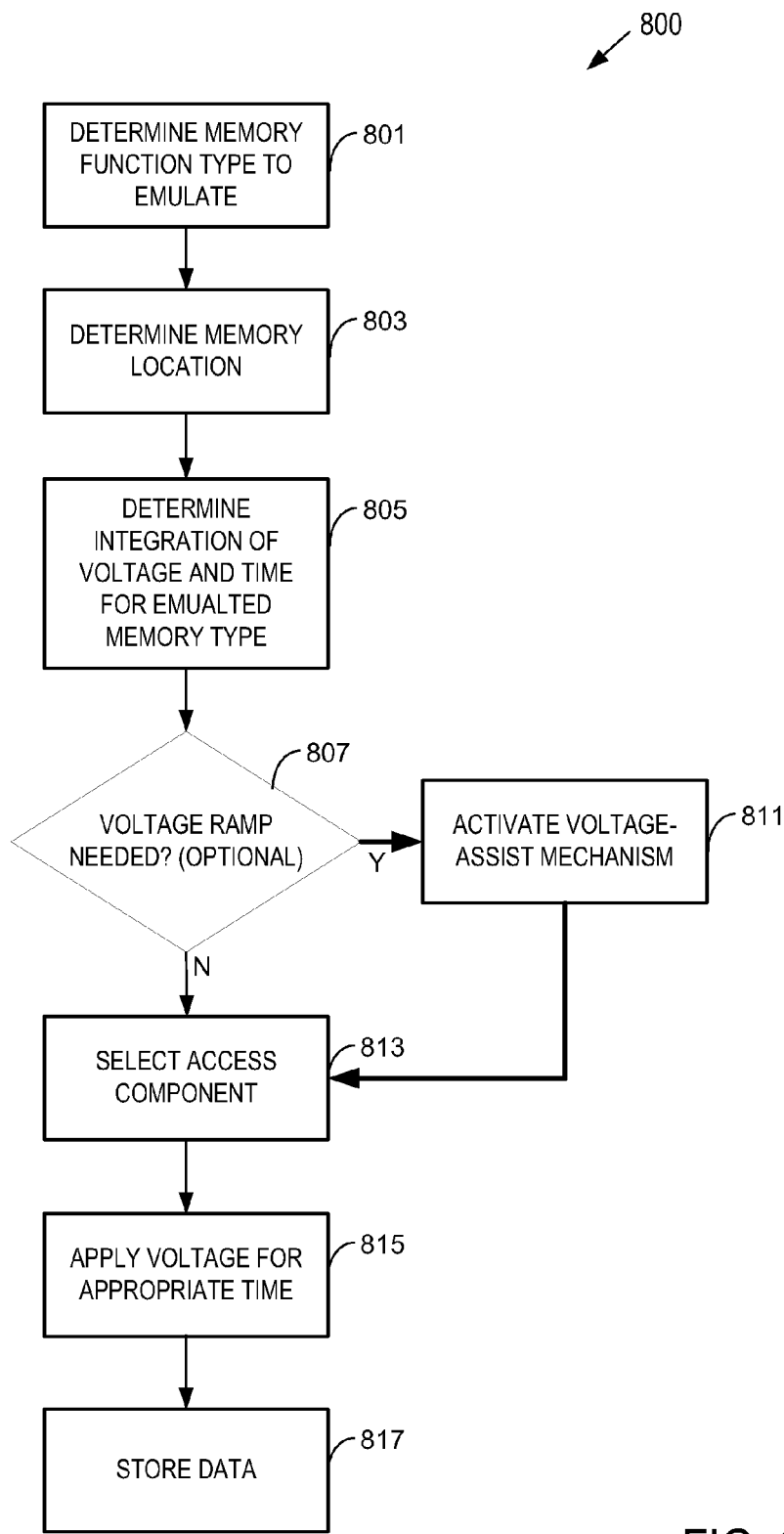
FIG. 8 is a flowchart showing an embodiment of a method to implement variable resistance states and memory functions.

Referring now to FIG. 8, a flowchart shows an embodiment of a method 800 to implement variable resistance states and memory function types of a RCM. At operation 801, a determination is made as to what type of memory function is to be emulated. For example, if the data are to be stored for a very short time period, such as to emulate a cache memory, then high programming speeds may be more important than data retention times. Conversely, if archival data storage is needed, programming times may be far less important than retention times.

Once the determination is made as to what type of memory function to emulate, then memory locations are determined at operation 803. Based on the earlier determination of memory emulation type at operation 801, a determination of voltage pulse amplitude and duration is made at operation 805. The determination of pulse voltage and duration may be determined with the aid of Table I. If a determination is made at operation 805 that the voltage exceeds, for example, an available power supply voltage, then operation 807 may be performed when a ramp-up in voltage (i.e., a voltage ramp) is required. For example, if a maximum voltage on a power rail is only 1.8 V but the programming voltage requirement is 3.0 V or more, then a separate voltage-assist mechanism, such as a charge pump, may be activated at operation 811 to deliver the desired programming voltage. Voltage assist mechanisms, such as charge pumps, are known independently by those of ordinary skill in the art.

At operation 813, a specific RCM is accessed by selecting the access component to operate. The access component may be similar or identical to the access component 313 of FIG. 3. The determined amplitude of the voltage pulse is then applied to the RCM for the determined time duration at operation 815 and the data are stored in the RCM at operation 817. A person of ordinary skill in the art, upon reading and understanding the disclosure provided herein, will recognize that several of the acts detailed with respect to the method 800 are optional, and, also, may be performed either in parallel or in an order different than that shown.

Figure 9:
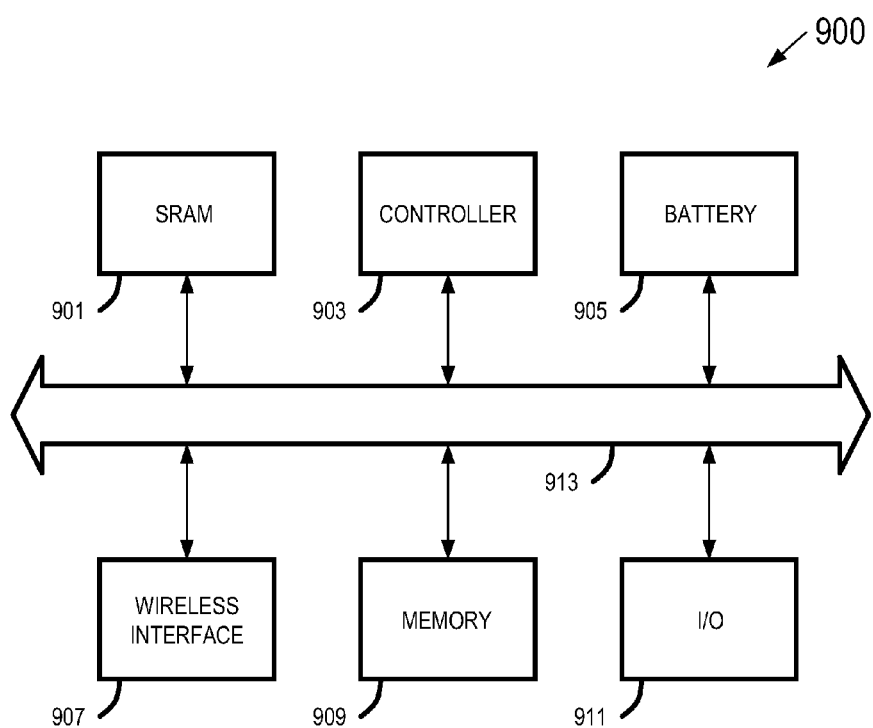
FIG. 9 shows a block diagram of a system embodiment, including a memory device.

With reference now to FIG. 9, a block diagram of an illustrative embodiment of an apparatus in the form of a system 907 (e.g., an electronic system) including one or more memory devices (e.g., the memory device 101 of FIG. 1 or the memory circuit 700 of FIG. 7) is shown. The system 907 may be used in devices such as, for example, a personal digital assistant (PDA), a laptop or portable computer with or without wireless capability, a web tablet, a wireless telephone, a pager, an instant messaging device, a digital music player, a digital camera, or other devices that may be adapted to transmit or receive information either wirelessly or over a wired connection. The system 907 may be used in any of the following systems: a wireless local area network (WLAN) system, a wireless personal area network (WPAN) system, or a cellular network.

The system 907 of FIG. 9 is shown to include a controller 903, an input/output (I/O) device 915 (e.g., a keypad, a touchscreen, or a display), a memory device 913, a wireless interface 911, and a static random access memory (SRAM) device 901 coupled to each other via a bus 909. A battery 905 may supply power to the system 907 in one embodiment. The memory device 913 may include a NAND memory, a flash memory, a NOR memory, a combination of these, or the like, as well as one or more of the novel memory devices described herein.

The controller 903 may include, for example, one or more microprocessors, digital signal processors, micro-controllers, or the like. The memory device 913 may be used to store information transmitted to or by the system 907. The memory device 913 may optionally also be used to store information in the form of instructions that are executed by the controller 903 during operation of the system 907 and may be used to store information in the form of user data either generated, collected, or received by the system 907 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 903 may include one or more of the novel memory devices described herein.

The I/O device 915 may be used to generate information. The system 907 may use the wireless interface 911 to transmit and receive information to and from a wireless communication network with a radio frequency (RF) signal. Examples of the wireless interface 911 may include an antenna, or a wireless transceiver, such as a dipole or patch antenna. However, the scope of the inventive subject matter is not limited in this respect. Also, the I/O device 915 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 915 may include one or more of the novel memory devices described herein.

The various illustrations of the methods and apparatuses herein are intended to provide a general understanding of the structure of various embodiments and are not intended to provide a complete description of all the elements and features of the apparatuses and methods that might make use of the structures, features, and materials described herein.

The apparatuses of the various embodiments may include or be included in, for example, electronic circuitry used in high-speed computers, communication and signal processing circuitry, single or multi-processor modules, single or multiple embedded processors, multi-core processors, data switches, and application-specific modules including multilayer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

A person of ordinary skill in the art will appreciate that, for this and other methods (e.g., programming or read operations) disclosed herein, the activities forming part of various methods may be implemented in a differing order, as well as repeated, executed simultaneously, or substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to comply with 37 C.F.R. §1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising a plurality of resistance change memory (RCM) cells, the apparatus comprising:
    a first region of the RCM cells;
    a second region of the RCM cells; and
    drive circuitry to selectively provide one of a plurality of signal pulse types to the first region of the RCM cells and to selectively provide a different one of the plurality of signal pulse types to the second region of the RCM cells, each of the plurality of signal pulse types having a different attribute and corresponding to one of a plurality of different memory function types, the plurality of different memory function types including volatile memory, storage class memory, and one-time programmable memory.

2. The apparatus of claim 1, wherein the drive circuitry comprises a first drive circuit electrically coupled to the first region of the RCM cells and a second drive circuit electrically coupled to the second region of the RCM cells.

3. The apparatus of claim 2, wherein the first drive circuit is configured to periodically refresh the first region of the RCM cells by providing a refresh pulse.

4. The apparatus of claim 1, wherein the first and the second regions of the RCM cells comprises first and second arrays of the RCM cells.

5. The apparatus of claim 1, wherein the plurality of signal pulse types comprise a plurality of programming pulse types.

6. The apparatus of claim 1, wherein the attribute comprises a pulse time duration.

7. The apparatus of claim 1, wherein the attribute comprises a pulse amplitude.

8. The apparatus of claim 1, wherein the attribute comprises a pulse energy level.

9. The apparatus of claim 1, wherein the attribute comprises a number of pulses.

10. The apparatus of claim 1, wherein the attribute comprises an integration of a pulse amplitude and a pulse time duration.

11. The apparatus of claim 1, wherein the RCM cells comprise conductive-bridging random access memory (CBRAM) cells.

12. An apparatus, comprising:
a plurality of memory regions, each of the plurality of memory regions including a respective plurality of resistance change memory cells;
control and select circuitry to determine a memory function type to emulate for information to be stored in the apparatus and to select one of the plurality of memory regions to store the information, the memory function type to include at least one of the group comprising volatile memory, storage class memory, and one-time programmable memory; and
drive circuitry to provide to the selected one of the plurality of memory regions a pulse configured to emulate the determined memory function type for the information.

13. The apparatus of claim 12, wherein the plurality of memory regions, the control and select circuitry, and the drive circuitry are all formed on a single die.

14. The apparatus of claim 12, wherein the drive circuitry being configured to provide the pulse configured to emulate the determined memory function type comprises drive circuitry configured to provide a pulse having an amplitude and time duration configured to emulate the determined memory function type.

15. The apparatus of claim 12, the plurality of memory regions comprise first and second memory regions and the drive circuitry comprises a first drive circuit and a second drive circuit electrically coupled to the first and second memory regions, respectively.

16. The apparatus of claim 15, wherein each of the first drive circuit and the second drive circuit is configured to match a respective power requirement of the first memory region and the second memory region, respectively.

17. A method of operating a plurality of resistance change memory (RCM) cells; the method comprising:

determining one of a plurality of memory function types to emulate, the plurality of different memory function types including volatile memory, storage class memory, and one-time programmable memory; and
applying a programming pulse, having an attribute configured to emulate the determined memory function type, to a selected one of the plurality of RCM cells.

18. The method of claim 17, wherein the attribute comprises a voltage amplitude of the programming pulse, and further comprising determining whether a voltage-ramp is needed to provide the voltage amplitude of the programming pulse.

19. The method of claim 18, further comprising activating a voltage-assist mechanism in response to determining that the voltage-ramp is needed to provide the voltage amplitude.

20. The method of claim 17, further comprising activating an access component of the selected one of the plurality of RCM cells.

21. A memory apparatus, comprising:
a resistance change memory (RCM) cell; and
drive circuitry electrically coupled to the RCM cell to provide a signal pulse, the signal pulse being configurable in both amplitude and time duration to vary a data retention time of the RCM cell by controlling both a height parameter and a radial growth parameter of a localized conduction region of the RCM cell.

22. The memory apparatus of claim 21, wherein the signal pulse is configurable to vary a localized conduction region formed within the RCM cell to emulate a selected one of a plurality of memory function types, the plurality of memory function types including volatile memory, storage class memory, and one-time programmable memory.

23. The memory apparatus of claim 21, wherein the drive circuitry is configured to vary the time duration of the signal pulse to vary the data retention time of the RCM cell.

24. The memory apparatus of claim 21, wherein the drive circuitry is configured to vary the amplitude of the signal pulse to vary the data retention time of the RCM cell.

25. The memory apparatus of claim 21, wherein the drive circuitry is configured to provide a sequence of pulses to vary the data retention time of the RCM cell.

26. The memory apparatus of claim 21, wherein the RCM cell comprises an anode, a cathode, and a solid electrolyte, a characteristic of the localized conduction region formed in the solid electrolyte being configurable to vary the data retention time of the RCM cell.

27. A method of operating a memory device, the method comprising:
selecting one of a plurality of memory function types to emulate within the memory device, the plurality of memory function types including volatile memory, storage class memory, and one-time programmable memory;
selecting an energy level per memory cell to be provided in a signal pulse to emulate the selected memory function type; and
applying the signal pulse to a memory cell of the memory device.

28. The method of claim 27, wherein the selected energy level corresponds to a state of a localized conduction region within the memory cell.

29. The method of claim 27, wherein selecting the energy level per memory cell comprises selecting a time duration of the signal pulse.

30. The method of claim 27, wherein selecting the energy level per memory cell comprises selecting an amplitude of the signal pulse.

31. The method of claim 27, wherein selecting the energy level comprises selecting a current delivered to the memory cell over a duration of the signal pulse.

32. The method of claim 27, wherein selecting one of the plurality of memory function types to emulate within the memory device comprises selecting one of a plurality of data retention times.

33. The method of claim 27, wherein selecting the energy level comprises selecting a current compliance.

34. A method of programming a resistance change memory (RCM) cell, the method comprising:

determining a retention period needed for information to be stored in the RCM cell; and varying an amount of power consumed to program the RCM cell depending upon the determined retention period, the amount of power to control both a height parameter and a radial growth parameter of a localized conduction region of the RCM cell.

35. An apparatus comprising:

a first group of resistance change memory (RCM) cells emulating a first memory type function; and a second group of resistance change memory (RCM) cells emulating a second memory type function, the first memory type function and the second memory type function including volatile memory, storage class memory, and one-time programmable memory, the first group of RMC cells and the second group of RMC cells being formed on a single integrated circuit.

36. The apparatus of claim 35, wherein the first and second groups of RCM cells are arranged in different locations of the integrated circuit.

37. A method of programming a resistance change memory (RCM) cell, the method comprising:

determining a endurance level needed for information to be stored in the RCM cell; and varying an amount of power consumed to program the RCM cell depending upon the determined endurance level, the amount of power to control both a height parameter and a radial growth parameter of a localized conduction region of the RCM cell.

38. A method of programming a resistance change memory (RCM) an RMC cell, the method comprising:

determining an operating speed needed for information to be stored in the cell; and varying an amount of power consumed to program the RCM cell depending upon the determined operating speed, the amount of power to control both a height parameter and a radial growth parameter of a localized conduction region of the RCM cell.

39. The apparatus of claim 1, wherein the plurality of different memory function types is to be emulated by controlling both a height parameter and a radial growth parameter of a localized conduction region of the RCM cells.

40. The apparatus of claim 21, wherein the height parameter and the radial growth parameter are to be controlled by selecting at least one of the group including a range of program-to-erase voltages, a range of program-to-erase pulse durations, and a range of set-to-reset current compliances.

* * * * *

UNITED STATES PATENT AND TRADEMARK OFFICE
CERTIFICATE OF CORRECTION

PATENT NO. : 8,804,399 B2  
APPLICATION NO. : 13/428944  
DATED : August 12, 2014  
INVENTOR(S) : Scott Sills Page 1 of 1

It is certified that error appears in the above-identified patent and that said Letters Patent is hereby corrected as shown below:

In the Claims

Column 19, line 25-26, in Claim 35, after "first group of" delete "RMC" and insert -- RCM --, therefor.
Column 19, line 26, in Claim 35, after "second group of" delete "RMC" and insert -- RCM --, therefor.
Column 20, line 11, in Claim 38, after "(RCM)" delete "an RMC".

Signed and Sealed this
Fourth Day of November, 2014

Michelle K. Lee
*Deputy Director of the United States Patent and Trademark Office*